United States Patent
Huang et al.

(10) Patent No.: US 11,177,142 B2
(45) Date of Patent: Nov. 16, 2021

(54) METHOD FOR DICING INTEGRATED FAN-OUT PACKAGES WITHOUT SEAL RINGS

(71) Applicant: Taiwan Semiconductor Manufacturing Company, Ltd., Hsinchu (TW)

(72) Inventors: Li-Hsien Huang, Zhubei (TW); Yueh-Ting Lin, Taipei (TW); An-Jhih Su, Taoyuan (TW); Ming Shih Yeh, Zhubei (TW); Der-Chyang Yeh, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/908,466

(22) Filed: Feb. 28, 2018

(65) Prior Publication Data

US 2019/0164783 A1    May 30, 2019

Related U.S. Application Data

(60) Provisional application No. 62/593,019, filed on Nov. 30, 2017.

(51) Int. Cl.
  *H01L 21/56*    (2006.01)
  *H01L 23/31*    (2006.01)
  (Continued)

(52) U.S. Cl.
  CPC ........ *H01L 21/561* (2013.01); *H01L 21/6835* (2013.01); *H01L 23/3135* (2013.01);
  (Continued)

(58) Field of Classification Search
  CPC . H01L 21/561; H01L 23/3128; H01L 25/162; H01L 23/3135; H01L 24/24;
  (Continued)

(56) References Cited

U.S. PATENT DOCUMENTS 7,838,424 B2    11/2010    Karta et al.
7,863,742 B2    1/2011    Yu et al.
(Continued)

FOREIGN PATENT DOCUMENTS

DE    102015105855 A1    2/2016
DE    102015106576 A1    3/2016

*Primary Examiner* — Nelson Garces
(74) *Attorney, Agent, or Firm* — Slater Matsil, LLP

(57) ABSTRACT

A method includes attaching a first die and a second die to a carrier; forming a molding material between the first die and second die; and forming a redistribution structure over the first die, the second die and the molding material, the redistribution structure includes a first redistribution region; a second redistribution region; and a dicing region between the first redistribution region and the second redistribution region. The method further includes forming a first opening and a second opening in the dicing region, the first opening and the second opening extending through the redistribution structure and exposing the molding material; and separating the first die and the second die by cutting through a portion of the molding material aligned with the dicing region from a second side of the molding material toward the first side of the molding material, the second side opposing the first side.

20 Claims, 13 Drawing Sheets

(51) Int. Cl.
*H01L 25/16* (2006.01)
*H01L 21/683* (2006.01)
*H01L 23/00* (2006.01)
*H01L 25/00* (2006.01)

(52) U.S. Cl.
CPC .............. *H01L 24/19* (2013.01); *H01L 24/20* (2013.01); *H01L 24/24* (2013.01); *H01L 24/25* (2013.01); *H01L 24/96* (2013.01); *H01L 24/97* (2013.01); *H01L 25/162* (2013.01); *H01L 25/50* (2013.01); H01L 23/3128 (2013.01); H01L 24/32 (2013.01); H01L 24/48 (2013.01); H01L 24/73 (2013.01); H01L 24/92 (2013.01); H01L 2221/68345 (2013.01); H01L 2221/68354 (2013.01); H01L 2224/04105 (2013.01); H01L 2224/12105 (2013.01); H01L 2224/24226 (2013.01); H01L 2224/24265 (2013.01); H01L 2224/2518 (2013.01); H01L 2224/25171 (2013.01); H01L 2224/32145 (2013.01); H01L 2224/32225 (2013.01); H01L 2224/48091 (2013.01); H01L 2224/48227 (2013.01); H01L 2224/73209 (2013.01); H01L 2224/73259 (2013.01); H01L 2224/73265 (2013.01); H01L 2224/73267 (2013.01); H01L 2224/92244 (2013.01); H01L 2224/97 (2013.01); H01L 2225/0651 (2013.01); H01L 2225/06568 (2013.01); H01L 2225/1035 (2013.01); H01L 2225/1041 (2013.01); H01L 2225/1058 (2013.01); H01L 2225/1076 (2013.01); H01L 2924/15311 (2013.01); H01L 2924/1815 (2013.01)

(58) Field of Classification Search
CPC ......... H01L 25/50; H01L 24/96; H01L 24/25; H01L 2224/25171; H01L 2224/73259; H01L 2224/73209; H01L 2224/24226; H01L 2224/24265; H01L 2224/2518; H01L 21/02013; H01L 21/02024; H01L 21/2633; H01L 21/304–3046; H01L 21/32131–32132; H01L 21/463; H01L 21/4842; H01L 21/4878; H01L 21/4896; B23K 26/00–07; B23K 26/362; B23K 26/364; B23K 26/38; B23K 26/382; B23K 26/384; B23K 26/386; B23K 26/388; B28D 5/022–029; B28D 5/04–047

See application file for complete search history.

(56) References Cited

U.S. PATENT DOCUMENTS

| | | | |
|---|---|---|---|
| 7,932,601 | B2 | 4/2011 | Chang et al. |
| 8,754,508 | B2 | 6/2014 | Chen et al. |
| 8,772,151 | B2 | 7/2014 | Chen |
| 8,846,548 | B2 | 9/2014 | Tu et al. |
| 9,443,780 | B2 | 9/2016 | Chen |
| 9,543,170 | B2 | 1/2017 | Yu et al. |
| 2006/0189099 | A1* | 8/2006 | Lu ............ H01L 21/78 438/460 |
| 2007/0099439 | A1* | 5/2007 | Borkulo ............ B23K 26/364 438/795 |
| 2013/0341800 | A1 | 12/2013 | Tu et al. |
| 2014/0015122 | A1 | 1/2014 | Chou et al. |
| 2014/0045379 | A1 | 2/2014 | Chen |
| 2014/0048926 | A1 | 2/2014 | Wang et al. |
| 2014/0077356 | A1 | 3/2014 | Chen et al. |
| 2014/0183693 | A1 | 7/2014 | Tsai et al. |
| 2014/0187103 | A1 | 7/2014 | Chen et al. |
| 2014/0252558 | A1 | 9/2014 | Yu et al. |
| 2014/0252597 | A1 | 9/2014 | Tsai et al. |
| 2014/0252601 | A1 | 9/2014 | Lu et al. |
| 2014/0252608 | A1 | 9/2014 | Chen et al. |
| 2014/0262468 | A1 | 9/2014 | Chen et al. |
| 2014/0264885 | A1 | 9/2014 | Tsai et al. |
| 2016/0118333 | A1 | 4/2016 | Lin |
| 2016/0133784 | A1* | 5/2016 | Minamiru ............ H01L 21/78 438/33 |
| 2016/0240391 | A1* | 8/2016 | Chen ............ H01L 23/3185 |
| 2017/0062300 | A1* | 3/2017 | Cheng ............ H01L 21/568 |

* cited by examiner

METHOD FOR DICING INTEGRATED FAN-OUT PACKAGES WITHOUT SEAL RINGS

PRIORITY CLAIM AND CROSS-REFERENCE

This application claims priority to U.S. Provisional Patent Application No. 62/593,019 filed Nov. 30, 2017, entitled "Integrated Fan-Out Packages and Methods of Forming the Same," which application is hereby incorporated by reference in its entirety.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area. As the demand for even smaller electronic devices has grown recently, there has grown a need for smaller and more creative packaging techniques of semiconductor dies.

An example of these packaging technologies is the Package-on-Package (POP) technology. In a PoP package, a top semiconductor packages is stacked on top of a bottom semiconductor package to allow high level of integration and component density. Another example is the Multi-Chip-Module (MCM) technology, where multiple semiconductor dies are packaged in one semiconductor package to provide semiconductor devices with integrated functionalities.

The high level of integration of advanced packaging technologies enables production of semiconductor devices with enhanced functionalities and small footprints, which is advantageous for small form factor devices such as mobile phones, tablets and digital music players. Another advantage is the shortened length of the conductive paths connecting the interoperating parts within the semiconductor package. This improves the electrical performance of the semiconductor device, since shorter routing of interconnections between circuits yields faster signal propagation and reduced noise and cross-talk.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are discussed in the context of semiconductor packages and methods of forming the semiconductor packages, and in particular, integrated fan-out (InFO) semiconductor packages. In some embodiments, a plurality of semiconductor dies and conductive pillars are formed over a carrier, and a molding material is formed over the carrier and around the dies and around the conductive pillars. A redistribution structure is formed over the molding material, the dies and the conductive pillars to form a semiconductor structure that comprises multiple individual semiconductor packages that will be diced in subsequent processing. In accordance with some embodiments, no seal ring is formed in the redistribution structure around the dies, which saves space used for seal rings and allows for more individual semiconductor packages to be formed over the carrier, thus increasing the productivity of the manufacturing process. In some embodiments, to separate the individual semiconductor packages, a pre-cut process is performed to form openings in a first side of the semiconductor structure (e.g., in dicing regions of the redistribution structure), followed by a cutting process starting from a second side of the semiconductor structure opposing the first side. The openings formed by the pre-cut process may prevent or reduce delamination of the redistribution structure during the dicing process.

Figure 7A:
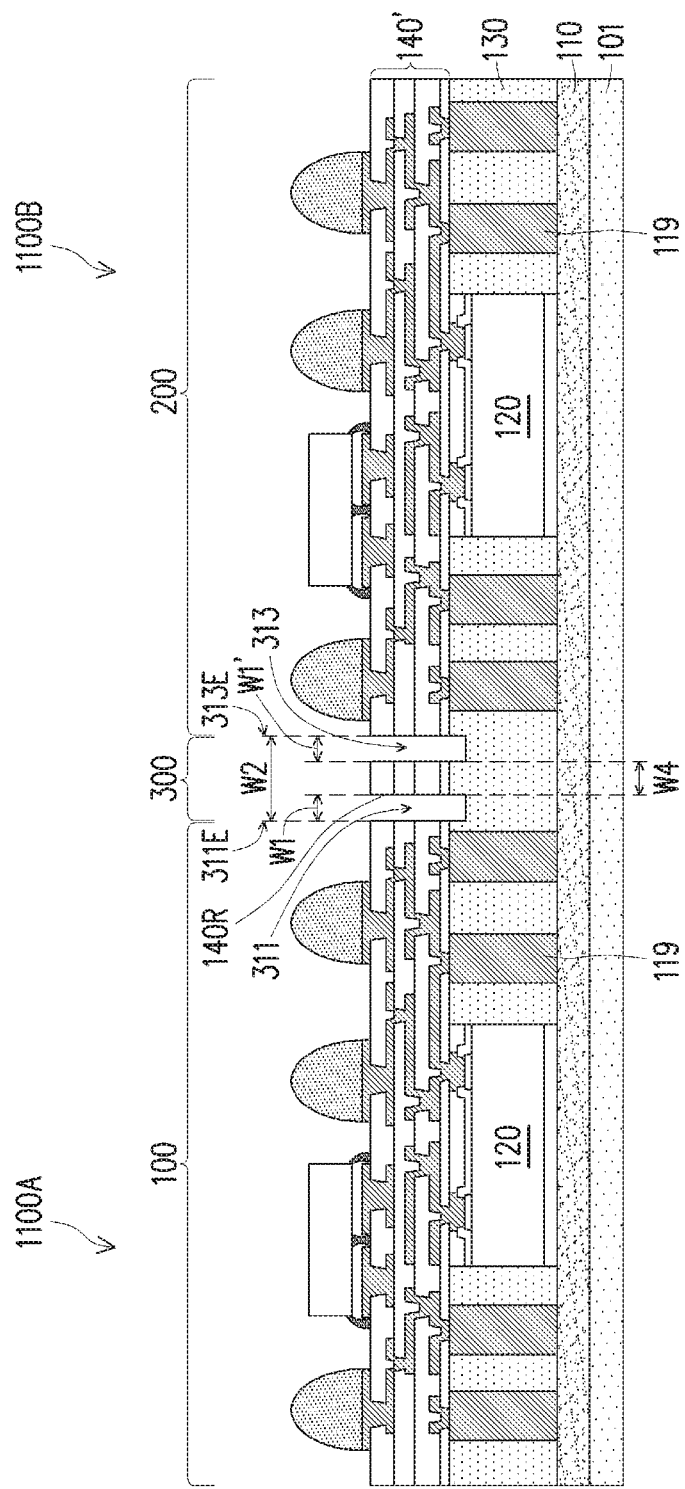
Figure 7B:
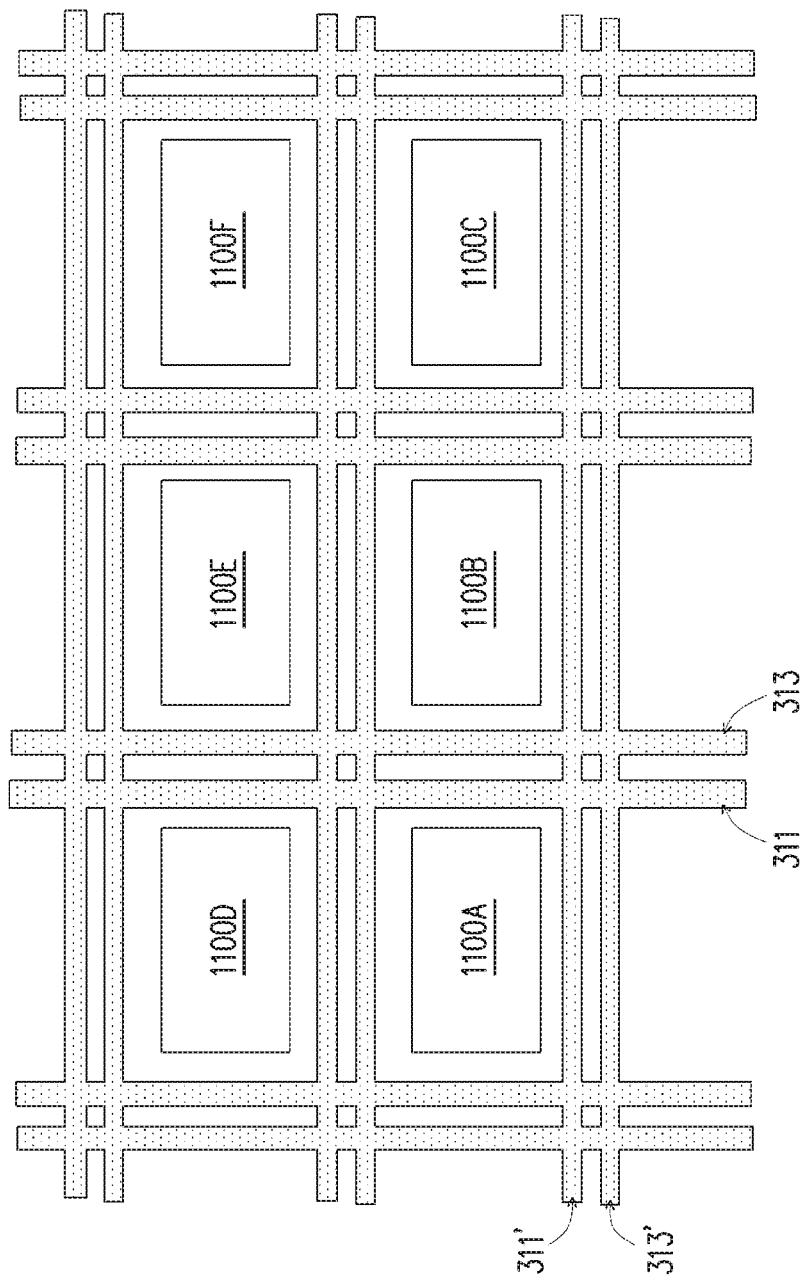
Figure 8:
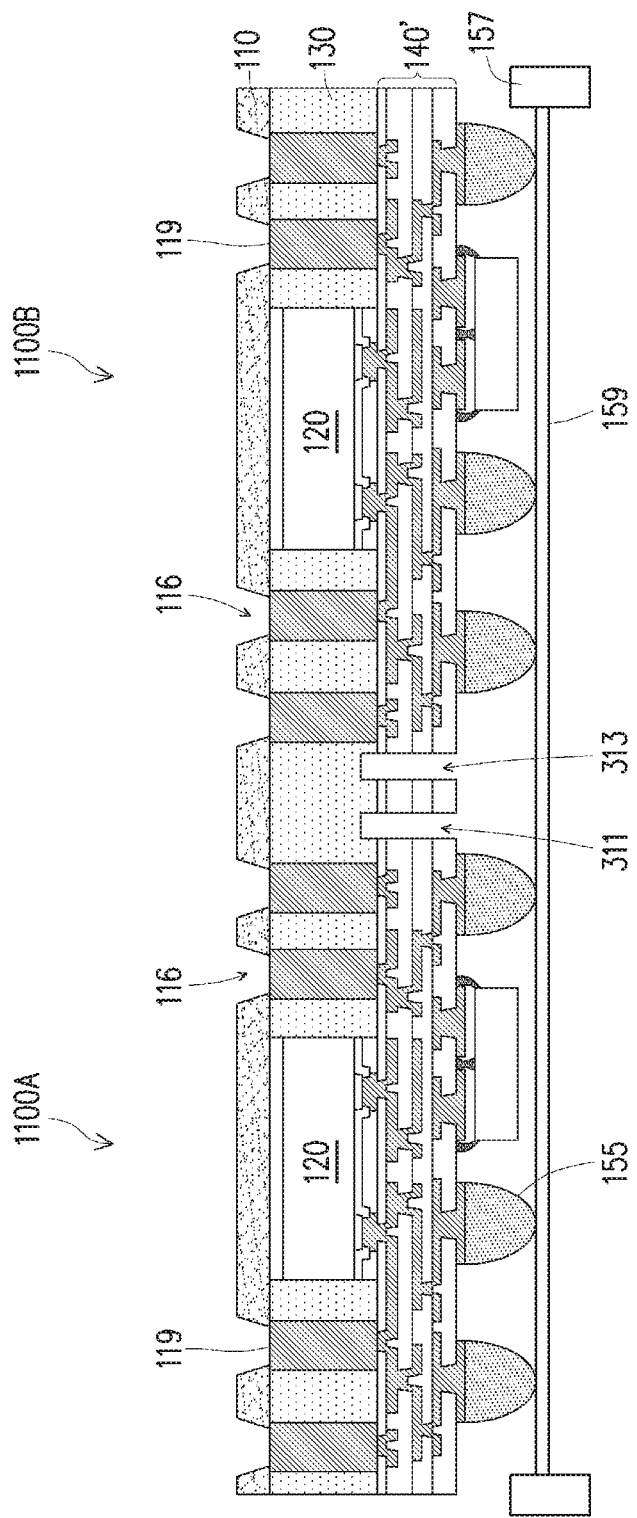
Figure 9:
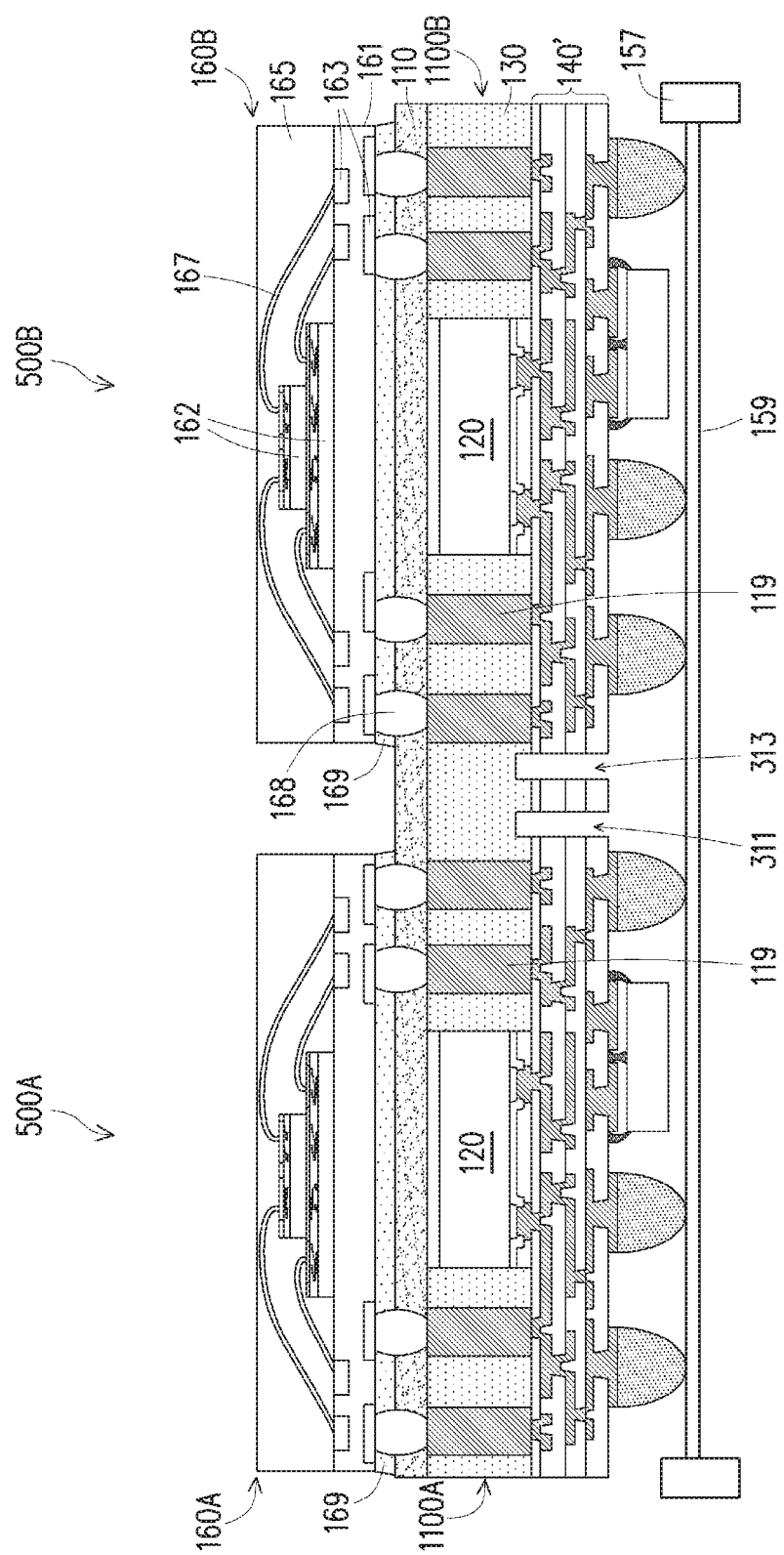
Figure 10:
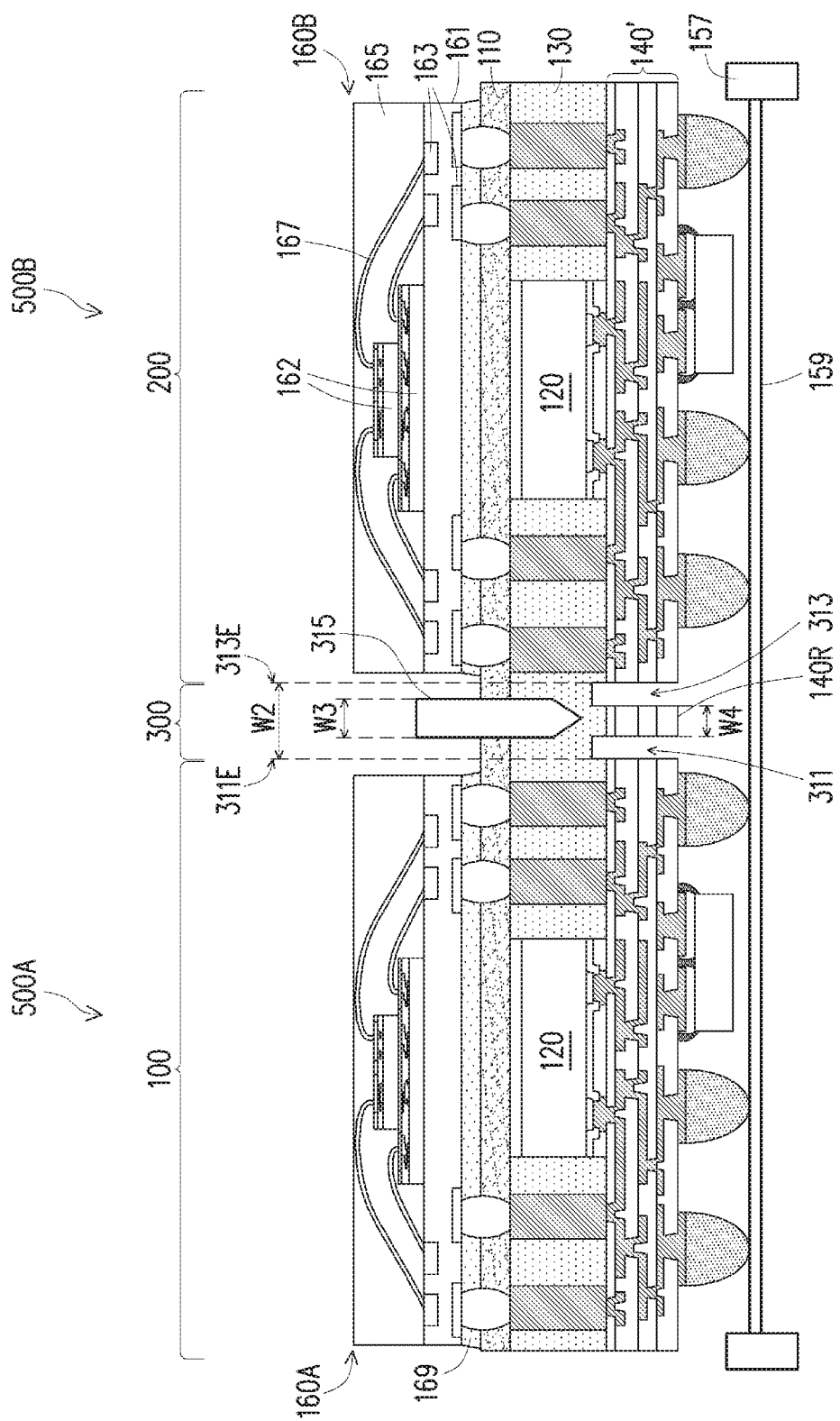
Figure 11:
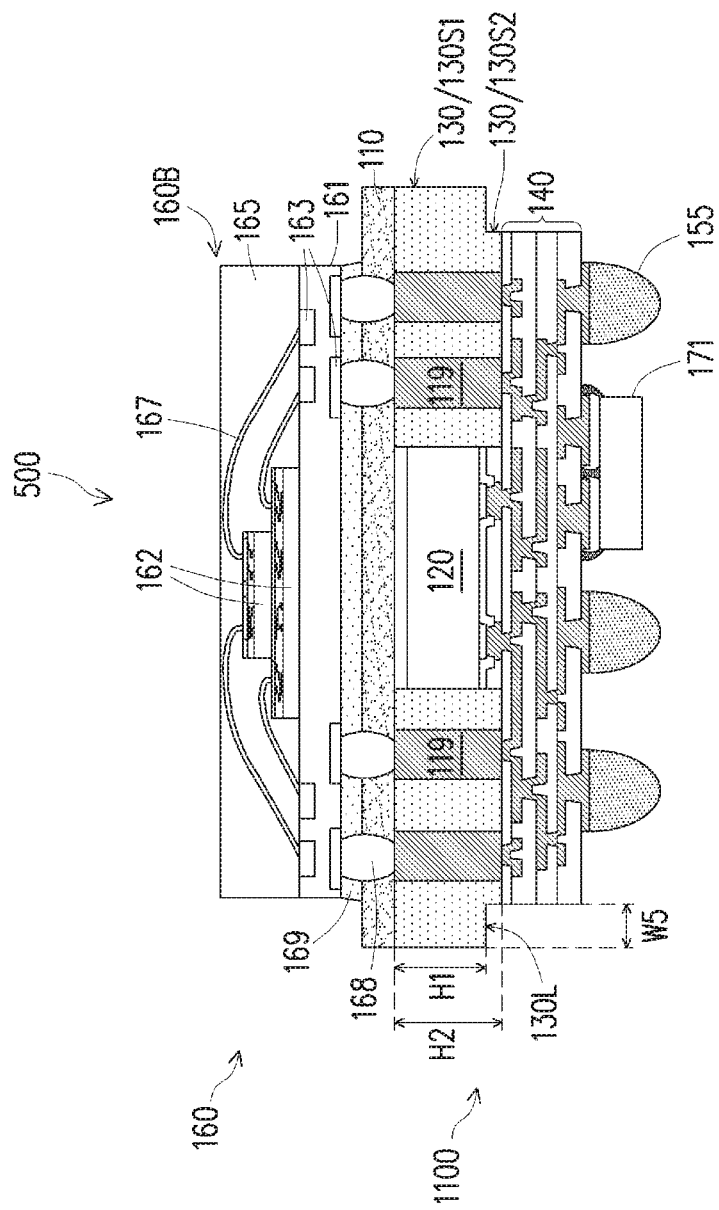

FIGS. 1-6, 7A, 7B, and 8-11 illustrate various views (e.g., cross-sectional view, top view) of a Package-on-Package (PoP) semiconductor package 500 at various stages of fabrication, in accordance with an embodiment. In particular, FIGS. 1-6, 7A, 7B and 8 illustrate various views of one or more bottom packages 1100 (e.g., 1100A, 1100B) of the PoP package, and FIGS. 9-11 illustrate cross-sectional views of the PoP package after top packages 160 (e.g., 160A, 160B) are attached to the bottom packages 1100.

Figure 1:
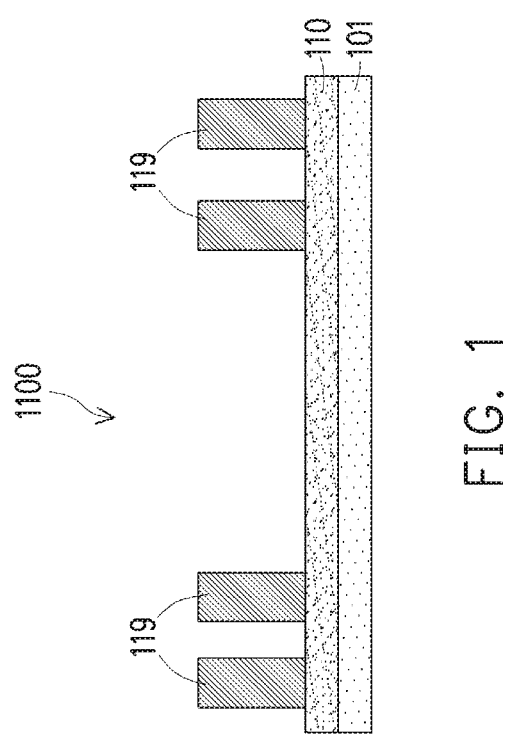
FIGS. 1-6, 7A, 7B, and 8-11 illustrate various views of a semiconductor package at various stages of fabrication, in accordance with an embodiment.

Referring to FIG. 1, a dielectric layer 110, which may be buffer layer, is formed over a carrier 101. Conductive pillars 119 are formed over the dielectric layer 110.

The carrier 101 may be made of a material such as silicon, polymer, polymer composite, metal foil, ceramic, glass, glass epoxy, beryllium oxide, tape, or other suitable material for structural support. In some embodiments, the dielectric layer 110 is formed of a polymer, such as polybenzoxazole (PBO), polyimide, benzocyclobutene (BCB), or the like; a nitride such as silicon nitride; an oxide such as silicon oxide, phosphosilicate glass (PSG), borosilicate glass (BSG), boron-doped phosphosilicate glass (BPSG), or the like. The dielectric layer 110 may be formed by a suitable deposition process, such as spin coating, chemical vapor deposition (CVD), laminating, the like, or a combination thereof.

In some embodiments, an adhesive layer (not shown) is deposited or laminated over the carrier 101 before the dielectric layer 110 is formed. The adhesive layer may be photosensitive and may be easily detached from the carrier 101 by, e.g., shining an ultra-violet (UV) light on the carrier 101 in a subsequent carrier de-bonding process. For example, the adhesive layer may be a light-to-heat-conversion (LTHC) coating made by 3M Company of St. Paul, Minn. or other suppliers.

Still referring to FIG. 1, conductive pillars 119 are formed over the dielectric layer 110. The conductive pillars 119 may be formed by: forming a seed layer over the dielectric layer 110; forming a patterned photoresist over the seed layer, where each of the openings in the patterned photoresist corresponds to a location of the conductive pillar 119 to be formed; filling the openings with an electrically conductive material such as copper using, e.g., electroplating or electroless plating; removing the photoresist using, e.g., an ashing or a stripping process; and removing portions of the seed layer on which the conductive pillars 119 are not formed. Other methods for forming the conductive pillars 119 are also possible and are fully intended to be included within the scope of the present disclosure. In some embodiments, the dielectric layer 110 is omitted, and the conductive pillars 119 are formed on the adhesive layer (e.g., LTHC coating) deposited or laminated over the carrier 101.

Figure 2:
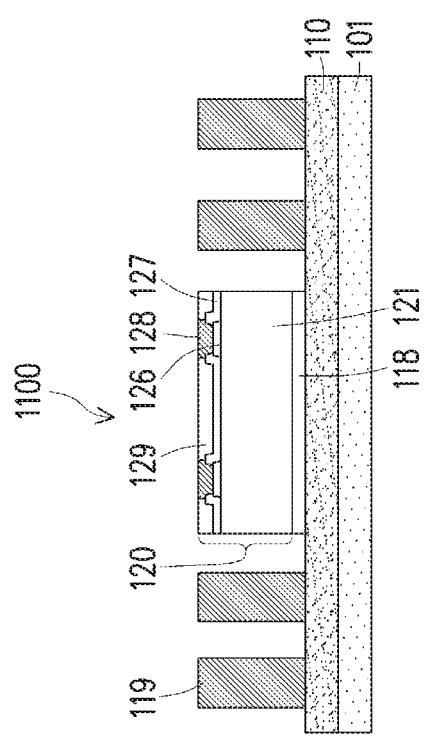

Next, in FIG. 2, a semiconductor die 120 (may also be referred to a die, or an integrated circuit (IC) die) is attached to the upper surface of the dielectric layer 110. An adhesive film 118, such as a die attaching film (DAF), may be used to attach the die 120 to the dielectric layer 110.

Before being adhered to the dielectric layer 110, the die 120 may be processed according to applicable manufacturing processes to form integrated circuits in the die 120. For example, the die 120 may include a semiconductor substrate and one or more overlying metallization layers, collectively illustrated as element 121. The semiconductor substrate may be, for example, silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not shown), such as transistors, diodes, capacitors, resistors, etc., may be formed in and/or on the semiconductor substrate and may be interconnected by the metallization layers, e.g., metallization patterns in one or more dielectric layers over the semiconductor substrate, to form an integrated circuit.

The die 120 further comprises pads 126, such as aluminum pads, to which external connections are made. The pads 126 are on what may be referred to as active side or front side of the die 120. Passivation film 127 is formed at the front side of the die 120 and on portions of the pads 126. Openings are formed extending through the passivation film 127 to the pads 126. Die connectors 128, such as conductive pillars (for example, comprising a metal such as copper), extend into the openings of the passivation film 127 and are mechanically and electrically coupled to the respective pads 126. The die connectors 128 may be formed by, for example, plating, or the like. The die connectors 128 are electrically coupled to the integrated circuits of the die 120.

A dielectric material 129 is formed at the active sides of the die 120, such as on the passivation film 127 and/or the die connectors 128. The dielectric material 129 laterally encapsulates the die connectors 128, and the dielectric material 129 is laterally coterminous with the die 120. The dielectric material 129 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; or a combination thereof, and may be formed, for example, by spin coating, lamination, CVD, or the like.

Figure 3:
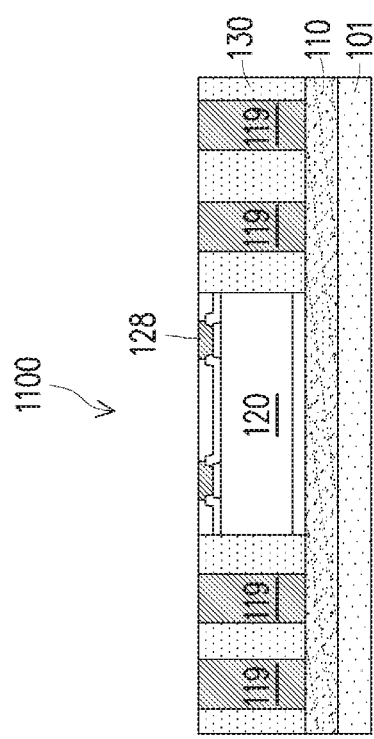

Next, in FIG. 3, a molding material 130 is formed over the dielectric layer 110, around the die 120 and around the conductive pillars 119. The molding material 130 may comprise an epoxy, an organic polymer, a polymer with or without a silica-based or glass filler added, or other materials, as examples. In some embodiments, the molding material 130 comprises a liquid molding compound (LMC) that is a gel type liquid when applied. The molding material 130 may also comprise a liquid or solid when applied. Alternatively, the molding material 130 may comprise other insulating and; or encapsulating materials. The molding material 130 is applied using a wafer level molding process in some embodiments. The molding material 130 may be molded using, for example compressive molding, transfer molding, or other methods.

Next, the molding material 130 is cured using a curing process, in some embodiments. The curing process may comprise heating the molding material 130 to a predetermined temperature for a predetermined period of time, using an anneal process or other heating process. The curing process may also comprise an ultra-violet (UV) light exposure process, an infrared (IR) energy exposure process, combinations thereof, or a combination thereof with a heating process. Alternatively, the molding material 130 may be cured using other methods. In some embodiments, a curing process is not included.

A planarization process, such as chemical and mechanical polish (CMP), may optionally be performed to remove excess portions of the molding material 130 over the front side of the die 120. After the planarization process, the molding material 130, the conductive pillar 119, and the die connectors 128 have a coplanar upper surface, in some embodiments.

Figure 4:
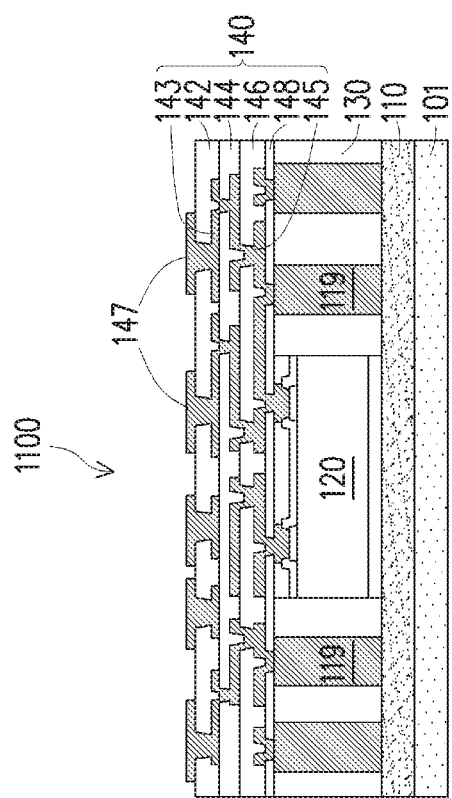

Referring next to FIG. 4, a redistribution structure 140 (may also be referred to as a front side redistribution structure) is formed over the molding material 130, the conductive pillar 119, and the die 120. The redistribution structure 140 comprises one or more layers of electrically conductive features (e.g., conductive lines 143, vias 145) formed in one or more dielectric layer (e.g., 142, 144, 146, and 148).

In some embodiments, the one or more dielectric layers (e.g., 142, 144, 146, and 148) are formed of a polymer, such as polybenzoxazole (PBO), polyimide, benzocyclobutene (BCB), or the like; a nitride such as silicon nitride; an oxide such as silicon oxide, phosphosilicate glass (PSG), borosilicate glass (BSG), boron-doped phosphosilicate glass (BPSG), or the like. The one or more dielectric layers may be formed by a suitable deposition process, such as spin coating, chemical vapor deposition (CVD), laminating, the like, or a combination thereof.

In some embodiments, the conductive features of the redistribution structure 140 comprise conductive lines (e.g., 143) and conductive vias (e.g., 145) formed of a suitable conductive material such as copper, titanium, tungsten, aluminum, or the like. In some embodiments, the conductive features are formed by forming openings in a dielectric layer of the redistribution structure 140 to expose underlying conductive features, forming a seed layer (not shown) over the dielectric layer and in the openings, forming a patterned photoresist (not shown) with a designed pattern over the seed layer, plating (e.g., electroplating or electroless plating) the conductive material in the designed pattern and over the seed layer, and removing the photoresist and portions of seed layer on which the conductive material is not formed. Other methods of forming the redistribution structure 140 are also possible and are fully intended to be included within the scope of the present disclosure.

The number of dielectric layers and the number of layers of the conductive features in the redistribution structure 140 of FIG. 4 are merely non-limiting examples. Other numbers of the dielectric layers and other numbers of layers of the conductive features are also possible and are fully intended to be included within the scope of the present disclosure.

FIG. 4 also illustrates under bump metallization (UBM) structures 147 formed over and electrically coupled to the redistribution structure 140. To form the UBM structures 147, openings are formed in the topmost dielectric layer (e.g., 142) of the redistribution structure 140 to expose conductive features (e.g., copper lines or copper pads) of the redistribution structure 140. After the openings are formed, the UBM structures 147 may be formed in electrical contact with the exposed conductive features. In an embodiment, the UBM structures 147 comprise three layers of conductive materials, such as a layer of titanium, a layer of copper, and a layer of nickel. However, there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBM structures 147. Any suitable materials or layers of material that may be used for the UBM structures 147 are fully intended to be included within the scope of the present disclosure.

The UBM structures 147 may be formed by forming a seed layer over the topmost dielectric layer (e.g., 142) and along the interior of the openings in the topmost dielectric layer; forming a patterned mask layer (e.g., photoresist) over the seed layer; forming (e.g., by plating) the conductive material(s) in the openings of the patterned mask layer and over the seed layer; removing the mask layer and remove portions of the seed layer on which the conductive material(s) is not formed. Other methods for forming the UBM structures 147 are possible and are fully intended to be included within the scope of the present disclosure. Upper surfaces of the UBM structures 147 in FIG. 4 are illustrated to be planar merely as an example, the upper surfaces of the UBM structures 147 may not be planar. For example, portions (e.g., peripheral portions) of each UBM structure 147 may be formed over the topmost dielectric layer (e.g., 142), and other portions (e.g., center portions) of each UBM structure 147 may be formed conformally along sidewalls of the topmost dielectric layer exposed by a corresponding opening, as skilled artisans ready appreciate.

Figure 5:
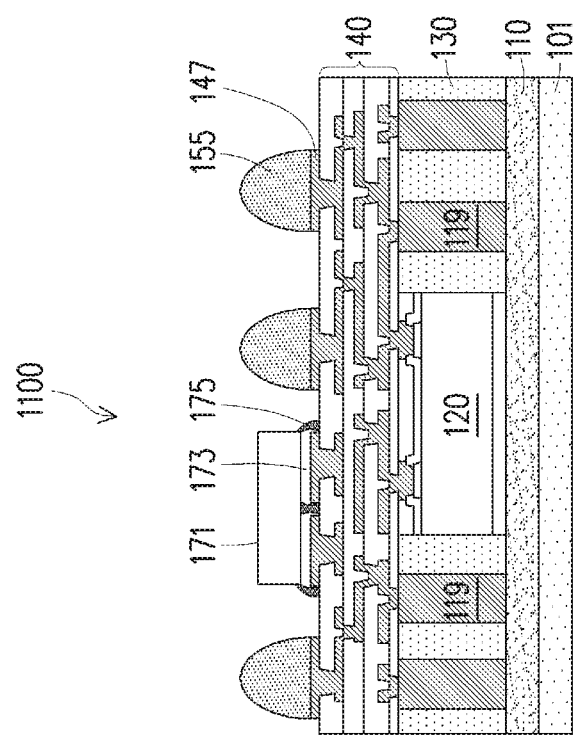

Next, in FIG. 5, connectors 155 are formed over the UBM structures 147 in accordance with some embodiments. The connectors 155 may be solder balls, metal pillars, controlled collapse chip connection (C4) bumps, micro bumps, electroless nickel-electroless palladium-immersion gold technique (ENEPIG) formed bumps, combination thereof (e.g., a metal pillar having a solder ball attached thereof), or the like. The connectors 155 may include a conductive material such as solder, copper, aluminum, gold, nickel, silver, palladium, tin, the like, or a combination thereof. In some embodiments, the connectors 155 comprise a eutectic material and may comprise a solder bump or a solder ball, as examples. The solder material may be, for example, lead-based and lead-free solders, such as Pb—Sn compositions for lead-based solder; lead-free solders including InSb; tin, silver, and copper (SAC) compositions; and other eutectic materials that have a common melting point and form conductive solder connections in electrical applications. For lead-free solder, SAC solders of varying compositions may be used, such as SAC 105 (Sn 98.5%, Ag 1.0%, Cu 0.5%), SAC 305, and SAC 405, as examples. Lead-free connectors such as solder balls may be formed from SnCu compounds as well, without the use of silver (Ag). Alternatively, lead-free solder connectors may include tin and silver, Sn—Ag, without the use of copper. The connectors 155 may form a grid, such as a ball grid array (BGA). In some embodiments, a reflow process may be performed, giving the connectors 155 a shape of a partial sphere in some embodiments. Alternatively, the connectors 155 may comprise other shapes. The connectors 155 may also comprise non-spherical conductive connectors, for example.

In some embodiments, the connectors 155 comprise metal pillars (such as a copper pillar) formed by a sputtering, printing, electro plating, electroless plating, CVD, or the like, with or without a solder material thereon. The metal pillars may be solder free and have substantially vertical sidewalls or tapered sidewalls.

FIG. 5 further illustrates an electrical device 171, such as an integrated passive device (IPD), that is electrically coupled to the redistribution structure 140 through, e.g., the UBM structures 147. Conductive joints 173, such as solder joints, may be formed between the electrical device 171 and redistribution structure 140. The conductive joints 173 may comprise a same material (e.g., solder) as the connectors 155. In addition, an underfill material 175 may be formed in a gap between the electrical device 171 and the redistribution structure 140.

The example of FIG. 5 illustrates one semiconductor package 1100 formed over the carrier 101 for illustration purpose. One skilled in the art will appreciate that tens of, hundreds of, or even more semiconductor packages (e.g., 1100) may be formed over the carrier 101 in the same processing steps as illustrated in FIGS. 1-5. FIGS. 6-10 illustrate further processing of the semiconductor package 1100 of FIG. 5 using an example where two semiconductor packages (e.g., 1100A and 1100B) are formed over a carrier 101, with the understanding that more than two semiconductor packages may be formed over the carrier 101.

Figure 6:
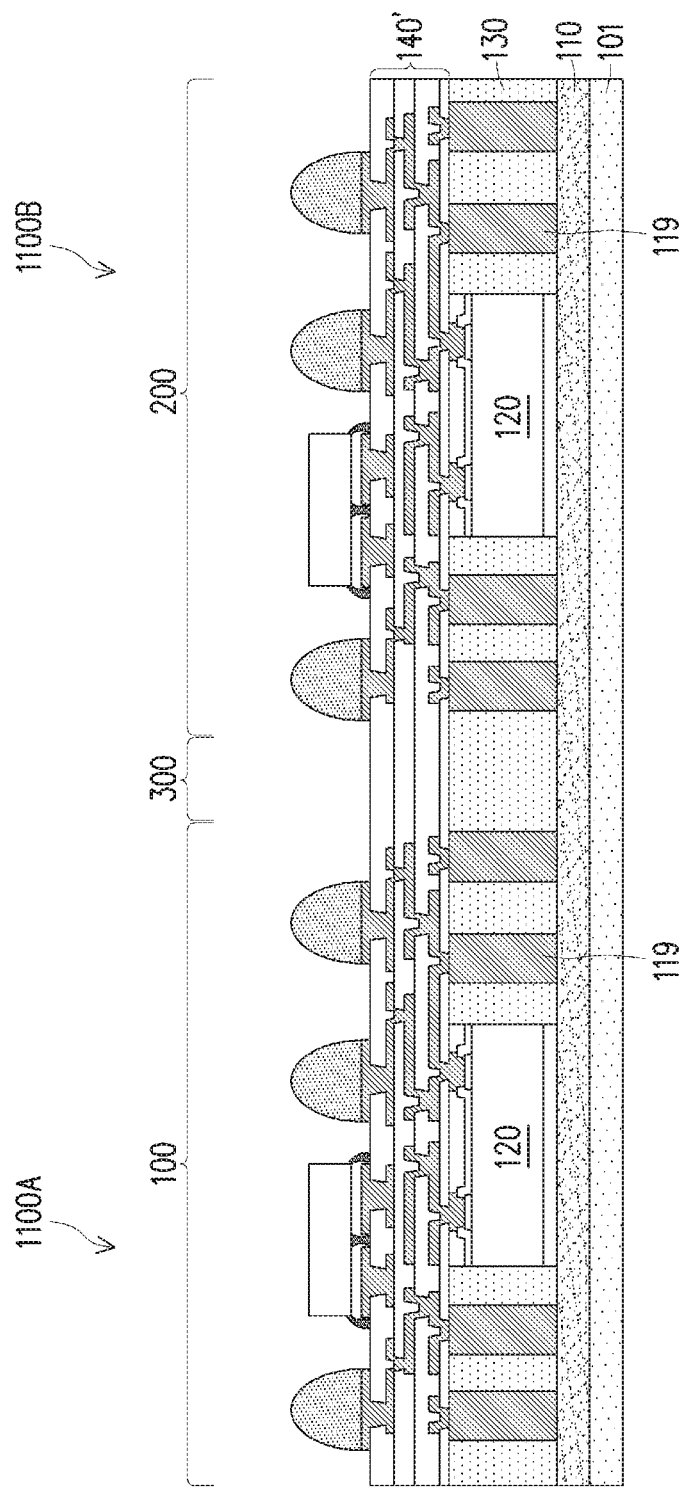

FIG. 6 illustrates a semiconductor structure comprising a semiconductor packages 1100A and a semiconductor package 1100B formed in regions 100 and 200 of the semiconductor structure, respectively. In the illustrated embodiment, each of the semiconductor packages 1100A and 1100B is the same as the semiconductor package 1100 illustrated in FIG. 5.

As illustrated in FIG. 6, a redistribution structure 140' is formed continuously over the molding material 130 and over all of the dies 120. A portion of the redistribution structure 140' in the region 100 is over (e.g., directly over) and electrically coupled to the die 120/conductive pillars 119 in the region 100, and corresponds to a redistribution structure such as the redistribution structure 140 illustrated in FIG. 5. Similarly, a portion of the redistribution structure 140' in the region 200 is over (e.g., directly over) and electrically coupled to the die 120/conductive pillars 119 in the region 200, and corresponds to another redistribution structure such as the redistribution structure 140 illustrated in FIG. 5.

As illustrated in FIG. 6, the redistribution structure 140' further comprises a portion in a region 300 (may also be referred to as a dicing region) between the regions 100 and 200. A width of the dicing region 300 may be between about 40 μm and about 260 μm, such as about 40 μm, although other dimensions are also possible. In some embodiments, the portion of the redistribution structure 140' in the region 300 comprises only the dielectric layers (see, e.g., 142, 144, 146, 148 in FIG. 4), and there is no electrically conductive features (e.g., conductive lines, visa) in the region 300. In addition, there is no seal ring formed in the redistribution structure 140', in the illustrated embodiment.

Seal rings generally comprise dummy conductive features, such as metal lines and metal vias that are formed in the redistribution structure (e.g., 140') around the perimeters of each semiconductor package (e.g., 1100A and 1100B). In other words, in a plan view, each of the seal rings has a ring shape (e.g., a rectangle shape) and encircles a respective semiconductor package (e.g., 1100A, 1100B). The metal lines and metal vias of the seal rings may be formed in the same processing steps and using the same material(s) as the conductive lines (see, e.g., 143 in FIG. 4) and the conductive vias (see, e.g., 145 in FIG. 4) of the redistribution structure 140'. For example, the metal lines and metal vias of the seal rings may be formed in the same dielectric layers that the conductive lines and the conductive vias of the redistribution structure 140' are formed, except that the metal lines and metal vias of the seal rings are electrically isolated. The seals rings are built to protect, e.g., the redistribution structure of the semiconductor packages from cracking and/or delamination during a subsequent dicing process. For example, when the blade of a dicing saw cuts into the dicing region 300 between two neighboring seal rings, cracks in the redistribution structure 140', which is caused by the blade, may be stopped by the seal rings and damage to the semiconductor packages may be avoided. Similarly, delamination of the redistribution structure 140, which may otherwise occur due to the dicing, may also be stopped or reduced by the seal rings.

The seal rings, however, take up space in the semiconductor structure. For example, a width of the seal ring may be about 40 μm, and areas with a total width of about 80 μm between two semiconductor packages (e.g., 1100A and 1100B) are used to form the seal rings. The present disclosure, by not forming any seal rings around the semiconductor packages (e.g., 1100A and 1100B) in the redistribution structure 140', frees up more space to form semiconductor packages on the carrier 101. For example, about 2% or more semiconductor packages may be formed on the carrier 101 by not forming the seal rings, thus achieving higher productivity. In addition, the pre-cut process and the dicing process, disclosed hereinafter, avoid or reduce cracks/delamination in the redistribution structure 140' without using the seal ring.

Referring now to FIG. 7A, a pre-cut process is performed to form openings 311/313 in the redistribution structure 140' in the dicing region 300. As illustrated in FIG. 7A, the opening 311 is formed proximate the semiconductor package 1100A and the opening 313 is formed proximate the semiconductor package 1100B. A width $W_1$ of the opening 311 is between about 20 μm and about 80 μm, and a width $W_1'$ of the opening 313 is between about 20 μm and about 80 μm. In some embodiment, the width $W_1$ is substantially the same as the width $W_1'$. In other embodiments, the width $W_1$ is different from the width $W_1'$. A width $W_2$ measured between a sidewall 311E of the opening 311 and a sidewall 313E of the opening 313 is between about 20 μm and about 80 μm, wherein the sidewall 311E is a sidewall of the opening 311 that is closest to the semiconductor package 1100A, and the sidewall 313E is a sidewall of the opening 313 that is closest to the semiconductor package 1100B, in some embodiments. The rectangular cross-sections of the openings 311 and 313 illustrated in FIG. 7A are merely non-limiting examples. Other shapes for the cross-sections of the openings 311 and 313 are possible and are fully intended to be included within the scope of the present disclosure. For example, the bottoms of the openings 311 and 313 may have irregular shapes depending on, e.g., the method used to form the openings.

As illustrated in FIG. 7A, portions of the dielectric layers of the redistribution structure 140' in the dicing region 300 are removed to form the openings 311/313. The openings 311 and 313 are physically separated from each other by a remaining portion 140R of the dielectric layers of the redistribution structure 140 in the dicing region 300, in the example of FIG. 7A. In some embodiments, a width $W_4$ of the remaining portion 140R is between about 140 μm and 200 μm. In addition, portions of the molding material 130 in the dicing region 300 are also removed to form the openings. Therefore, in the illustrated embodiment, the openings 311 and 313 extend through the redistribution structure 140 and into the molding material 130. For example, the openings 311 and 313 may extend into the molding material 130 by a depth in a range between about 20 μm and 100 μm.

In an exemplary embodiment, two laser beams are used to form the openings 311 and 313 at the same time. In other words, instead of forming the openings 311 and 313 sequentially, the openings 311 and 313 are formed in parallel using two laser beams to increase the throughput of production, although it is possible to use one laser beam to form the openings 311 and 313, e.g., sequentially. The laser used may be a $CO_2$ laser, a UV laser, or a green light laser, in some embodiments. Other types of laser, such as fiber laser and Yttrium-Aluminum-Garnet (YAG) laser, are also contemplated within the scope of the present disclosure. The average output power of the laser is in a range between about 0.5 watts and about 8 watts, in some embodiments, although other output power ranges are also possible and are fully intended to be included within the scope of the present disclosure. The average output power of the laser is determined by various factors such as the materials of the dielectric layers of the redistribution structure 140', depth of the openings 311/313, and the processing speed required.

In FIG. 7A, two openings 311/313 are formed by the pre-cut process, with each opening providing protection against cracking and/or delamination for an adjacent semiconductor package in a subsequent dicing process, as will be discussed in more details hereinafter with reference to FIG. 10. In particular, the opening 311 protects the redistribution structure of the semiconductor package 1100A, and the opening 313 protects the redistribution structure of the semiconductor package 1100B. Forming more than two openings between two adjacent semiconductor packages may not be necessary, since the additional opening(s), if formed, does not provide much additional protection against cracking and/or delamination of the redistribution structure 140' during dicing. On the other hand, forming only one opening, e.g., forming only 311 or only 313, may not provide protection for one of the two adjacent semiconductor packages. Although an opening having a wide width, e.g., an opening with a width extending from 311E to 313E, may be formed between two adjacent semiconductor packages to provide protection against cracking and/or delamination, forming such a wide opening may take a significantly longer time, and/or may require laser with much higher output power. Therefore, the two openings (e.g., 311 and 313) formed between two adjacent semiconductor packages by the pre-cut process, combined with the dicing process discussed hereinafter with reference to FIG. 10, provide an efficient (e.g., shorter fabrication time, and higher productivity) and easy-to-implement manufacturing process that does not require seal rings but still provides protection against cracking and delamination.

FIG. 7B illustrates a top view of the semiconductor structure of FIG. 7A, in some embodiments. Besides semiconductor packages 1100A and 1100B, additional semiconductor packages (e.g., 1100C, 1100D, 1100E and 1100F) formed on the carrier 101 are also illustrated in FIG. 7B. For simplicity, not all details of the semiconductor packages are shown in FIG. 7B. As illustrated in FIG. 7B, openings (e.g., 311, 313, 311', and 313') are formed in dicing regions between neighboring semiconductor packages by the pre-cut process. In the top view of FIG. 7B, each pair of openings (e.g., 311 add 313) between two neighboring semiconductor packages (e.g., 1100A and 1100B) may form two parallel trenches. The pre-cut process may form two parallel trenches along each side (e.g., sidewall) of a corresponding semiconductor package. In other words, each semiconductor package may be encircled by, e.g., four pairs of openings in the top view, with each side of the semiconductor package having a pair of openings (e.g., two parallel trenches) extending along the side of the semiconductor package.

Next, in FIG. 8, the semiconductor structure shown in FIG. 7A is flipped over, and the external connectors 155 are attached to a tape 159 (e.g., a dicing tape) supported by a frame 157. Next, the carrier 101 is de-bonded from the dielectric layer 110 by a suitable process, such as etching, grinding, or mechanical peel off. In an embodiment where an adhesive layer (e.g., an LTHC film) is formed between the carrier 101 and the dielectric layer 110, the carrier 101 is de-bonded by exposing the carrier 101 to a laser or UV light. The laser or UV light breaks the chemical bonds of the adhesive layer that binds to the carrier 101, and the carrier 101 can then be easily detached. The adhesive layer, if formed, may be removed by the carrier de-bonding process. Residues of the adhesive layer, if any, may be removed by a cleaning process performed after the carrier de-bonding process.

After de-bonding the carrier 101, openings 116 are formed in the dielectric layer 110 to expose the conductive pillars 119. To form the openings 116, a laser drilling process, an etching process, or the like, may be used. In some embodiments, the etching process is a plasma etch process. Although not shown, solder paste may be formed in the openings 116 using, e.g., a solder paste printing process, in preparation for attaching top packages (see FIG. 9).

In embodiments where the dielectric layer 110 is omitted and the conductive pillars 119 are formed over the adhesive layer (e.g., LTHC coating) deposited or laminated over the carrier 101, after the carrier de-bonding process, the conductive pillars 119 may be exposed at the upper surface of the molding material 130. Therefore, the drilling process or etching process used to expose the conductive pillars 119 may be omitted. FIGS. 8-11 illustrate the embodiment where the dielectric layer 110 is formed. One skilled in the art, upon reading the present disclosure, will be able to modify the processing illustrated in FIGS. 8-11 for embodiments where the dielectric layer 110 is omitted.

Referring next to FIG. 9, semiconductor packages 160A and 160B (also referred to as top packages), such as memory packages, are attached to the semiconductor packages 1100A and 1100B (also referred to as bottom packages), respectively, to form the semiconductor packages 500A and 500B in FIG. 9, thereby forming a plurality of semiconductor package 500 (e.g., 500A, 500B) with package-on-package (PoP) structures.

As illustrated in FIG. 9, each of the semiconductor packages 160 (e.g., 160A, 160B) has a substrate 161 and one or more semiconductor dies 162 (e.g., memory dies) attached to an upper surface of the substrate 161. In some embodiments, the substrate 161 includes silicon, gallium arsenide, silicon on insulator ("SOI") or other similar materials. In some embodiments, the substrate 161 is a multiple-layer circuit board. In some embodiments, the substrate 161 includes bismaleimide triazine (BT) resin, FR-4 (a composite material composed of woven fiberglass cloth with an epoxy resin binder that is flame resistant), ceramic, glass, plastic, tape, film, or other supporting materials. The substrate 161 may include conductive features (e.g., conductive lines and vias, not shown) formed in/on the substrate 161. As illustrated in FIG. 9, the substrate 161 has conductive pads 163 formed on the upper surface and a lower surface of the substrate 161, which conductive pads 163 are electrically coupled to the conductive features of the substrate 161. The one or more semiconductor dies 162 are electrically coupled to the conductive pads 163 by, e.g., bonding wires 167. A molding material 165, which may comprise an epoxy, an organic polymer, a polymer, or the like, is formed over the substrate 161 and around the semiconductor dies 162. In some embodiments, the molding material 165 is conterminous with the substrate 161, as illustrated in FIG. 8.

In some embodiments, a reflow process is performed to electrically and mechanically couple the conductive pads 163 of the semiconductor packages 160 to the conductive pillars 119 through conductive joints 168. In some embodiments, the conductive joints 168 comprise solder regions, conductive pillars (e.g., copper pillars with solder regions on at least end surfaces of the copper pillars), or any other suitable material(s).

After the reflow process, a baking process may be performed. The baking process may remove moisture on the semiconductor structure. Next, an underfill material 169 is formed in the gaps between top packages 160 (e.g., 160A, 160B) and the corresponding bottom packages 1100 (e.g., 1100A, 1100B). The underfill material 169 may be dispensed in the gaps between the top packages 160 and the bottom packages 1100 using, e.g., a needle or a jetting dispenser. A curing process may be performed to cure the underfill material 169. Although not shown, the underfill material 169 may extends along sidewalls of the top packages 160.

Next, in FIG. 10, a dicing process is performed to separate the PoP packages 500 (e.g., 500A, 500B) into a plurality of individual PoP packages. In an exemplary embodiment, a blade 315 with a width of $W_3$ is used to dice the PoP packages. The width $W_3$ is smaller than the width $W_2$ measured between the sidewall 311E of the opening 311 and the sidewall 313E of the opening 313, in some embodiments. In the illustrated embodiment, the blade 315 is positioned in a center region between the sidewall 311E and the sidewall 313E, and therefore, does not overlap or contact the sidewalls 311E/313E during the dicing process. In other words, the blade 315 is laterally between the sidewall 311E and the sidewall 313E. In some embodiments, the width $W_3$ of the blade 315 is wider than the width $W_4$ of the remaining portion 140R of the redistribution structure 140' disposed between the openings 311 and 313. This may allow the blade 315 to remove the remaining portion 140R in one cut to reduce the processing time of the dicing process. For example, the remaining portion 140R of the redistribution structure 140' may be laterally between opposing vertical sidewalls of the blade 315, such that as the blade 315 cuts downward toward the redistribution structure 140', the remaining portion 140R is removed in one cut.

As illustrated in FIG. 10, the blade 315 cuts into the dicing region 300 from a side of the semiconductor packages 1100 opposite the openings 311/313. In other words, the blade 315 starts cutting into the semiconductor structure shown in FIG. 10 from the upper surfaces of the bottom packages proximate the backsides of the dies 120. As the blade 315 travels toward the redistribution structure 140', besides the remaining portion 140R of the redistribution structure 140', the blade 315 does not contact the redistribution structure 140' due to the openings 311/313 isolating the blade 315 from the redistribution structure 140'. As a result, cracking and/or delamination of the redistribution structure 140' is avoided or reduced.

Although not shown, the pre-cut process and the dicing process illustrated in FIGS. 7-10 may be performed in other dicing regions, e.g., dicing regions between the PoP packages 500A/500B and other neighboring PoP packages (not shown). After the dicing process is finished, a plurality of individual PoP packages, such as the PoP package 500 illustrated in FIG. 11, are formed.

As illustrated in FIG. 11, the individual PoP packages 500 has a redistribution structure 140, with the die 120 and the conductive pillars 119 electrically coupled to the upper surface of the redistribution structure 140. The molding material 130 is formed over the redistribution structure 140 around the die 120 and around the conductive pillars 119. In the example of FIG. 11, the molding material 130 extends beyond lateral extents of the redistribution structure 140. In other words, the molding material 130 is wider than, thus not conterminous with, the redistribution structure 140. For example, the molding material 130 may extend laterally beyond the boundaries (e.g., sidewalls) of redistribution structure 140 by a width $W_5$, which may range from about 1 μm to about 810 μm. This is due to the width $W_3$ of the blade 315 being smaller than the width $W_2$ between sidewall 311E and sidewall 313E, in some embodiments.

As illustrated in FIG. 11, an upper portion (e.g., a portion distal the redistribution structure 140) of the molding material 130 has sidewalls 130S1 that extend beyond the lateral extents of the redistribution structure 140. Further, a lower portion (e.g., a portion physically contacting the redistribution structure 140) of the molding material 130 may have sidewalls 130S2 that are aligned with the sidewalls of the redistribution structure 140, e.g., the lower portion of the molding material 130 may have a same width as the redistribution structure 140.

Still referring to FIG. 11, the upper portion of the molding material 130 extending beyond the lateral extents of the redistribution structure 140 has a height $H_1$, which is smaller than a height $H_2$ of portions of the molding material 130 disposed within the lateral extents of the redistribution structure 140. Recall that the openings 311/313 may extend into the molding material 130 (see, e.g., FIG. 7A). This means that portions of the molding material 130 in the dicing region 300 are removed, thereby causing the smaller height $H_1$ for the upper portion of the molding material 130 disposed beyond boundaries (e.g., sidewalls) of the redistribution structure 140, in some embodiments. In FIG. 11, the lower surface 130L of the upper portions of the molding material 130 is shown as a flat surface. This is merely an example. As discussed above, depending on the process used to form the openings 311/313, the lower surface 130L may have other shapes (e.g., an irregular surface).

Variations of the disclosed embodiments are possible and are fully intended to be included within the scope of the present disclosure. For example, the number of dies 120 in each PoP package, the number and/or the location of the conductive pillars 119 in each PoP package may be modified. As another example, the dielectric layer 110 may be completely removed from the PoP package 500. As yet another example, the amount and/or shape of the underfill material 169 may be modified. For example, the underfill material 169 may be a continuous volume of dielectric material that fills the gap between the top package and the bottom package and extends continuously from a first conductive joint 168 to another conductive joint 168. Alternatively, the underfill material 169 may comprise multiple portions that are physically separated from each other, with each portion of the underfill material 169 surrounding a respective conductive joint 168.

Embodiments may achieve advantages. By omitting the seal ring in the redistribution structure, more space is available for forming the semiconductor packages, thereby achieving higher productivity. The disclosed pre-cut process and dicing process avoid or reduce cracking/delamination without the use of seal rings, thus allowing for the gain in the productivity without the problem associated with cracking and delamination.

Figure 12:
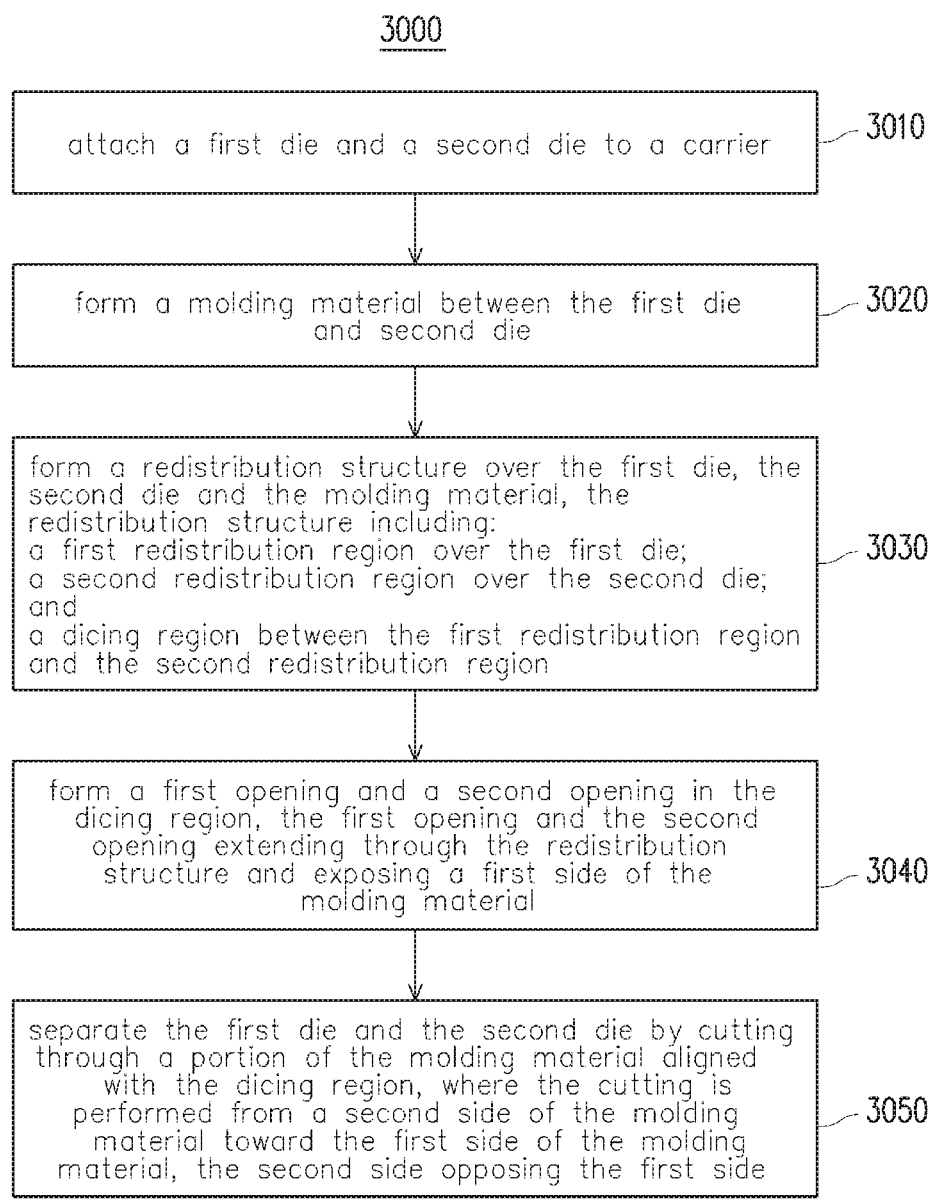
FIG. 12 illustrates a flow char of a method for forming a semiconductor package, in accordance with some embodiments.

FIG. 12 illustrates a flow chart of a method 3000 of fabricating a semiconductor device, in accordance with some embodiments. It should be understood that the embodiment method shown in FIG. 12 is merely an example of many possible embodiment methods. One of ordinary skill in the art would recognize many variations, alternatives, and modifications. For example, various steps as illustrated in FIG. 12 may be added, removed, replaced, rearranged and repeated.

Referring to FIG. 12, at step 3010, a first die and a second die are attached to a carrier. At step 3020, a molding material is formed between the first die and second die. At step 3030, a redistribution structure is formed over the first die, the second die and the molding material, the redistribution structure including a first redistribution region over the first die; a second redistribution region over the second die; and a dicing region between the first redistribution region and the second redistribution region. At step 3040, a first opening and a second opening are formed in the dicing region, the first opening and the second opening extending through the redistribution structure and exposing a first side of the molding material. At step 3050, the first die and the second die are separated by cutting through a portion of the molding material aligned with the dicing region, where the cutting is performed from a second side of the molding material toward the first side of the molding material, the second side opposing the first side.

In an embodiment, a method includes attaching a first die and a second die to a carrier; forming a molding material between the first die and second die; and forming a redistribution structure over the first die, the second die and the molding material, the redistribution structure includes a first redistribution region over the first die; a second redistribution region over the second die; and a dicing region between the first redistribution region and the second redistribution region. The method further includes forming a first opening and a second opening in the dicing region, the first opening and the second opening extending through the redistribution structure and exposing a first side of the molding material; and separating the first die and the second die by cutting through a portion of the molding material aligned with the dicing region, where the cutting is performed from a second side of the molding material toward the first side of the molding material, the second side opposing the first side. In an embodiment, the dicing region is free of electrically conductive features. In an embodiment, the first opening and the second opening are physically separated from each other. In an embodiment, the first opening and the second opening extend into the molding material. In an embodiment, forming the first opening and the second opening comprises using a first laser beam and a second laser beam to remove portions of the redistribution structure in the dicing region to form the first opening and the second opening, respectively. In an embodiment, the first laser beam and the second laser beam are applied to the dicing region at a same time. In an embodiment, the cutting is performed using a blade. In an embodiment, the first opening is laterally between the first die and the second opening, where a first width of the blade is smaller than a second width between a first sidewall of the first opening closest to the first die and a second sidewall of the second opening closest to the second die. In an embodiment, during the cutting, the blade is laterally between the first sidewall of the first opening and the second sidewall of the second opening. In an embodiment, the redistribution structure is free of a seal ring. In an embodiment, the method further includes, before separating the first die and the second die: forming a first conductive pillar in the molding material adjacent to the first die; forming a second conductive pillar in the molding material adjacent to the second die; and attaching a first package and a second package to the first conductive pillar and the second conductive pillar, respectively.

In an embodiment, a method includes forming a first conductive pillar and a second conductive pillar over a first side of a carrier; attaching a first die and a second die to the first side of the carrier, the first die and second die being adjacent to the first conductive pillar and the second conductive pillar, respectively; forming a molding material over the first side of the carrier, the molding material extending along sidewalls of the first die, sidewalls of the second die, sidewalls of the first conductive pillar and sidewalls of the second conductive pillar; forming a redistribution structure over the first die, the second die and the molding material, the redistribution structure comprising a first redistribution region over the first die, a second redistribution region over the second die, and a dicing region between the first redistribution region and the second redistribution region; removing portions of the redistribution structure in the dicing region to form a first opening proximate the first die and a second opening proximate the second die, the first opening being separated from the second opening by a remaining portion of the redistribution structure in the dicing region; de-bonding the carrier; electrically coupling a first semiconductor package to the first conductive pillar; electrically coupling a second semiconductor package to the second conductive pillar; and dicing, from a backside of the first die, through the molding material using a blade, the dicing separating the first die from the second die. In an embodiment, removing portions of the redistribution structure in the dicing region further removes portions of the molding material such that the first opening and the second opening extend into the molding material. In an embodiment, removing portions of the redistribution structure in the dicing region is performed using laser. In an embodiment, the blade has a first width, where a first sidewall of the first opening closest to the first die is spaced apart from a second sidewall of the second opening closest to the second die by a second width, and where the first width is smaller than the second width. In an embodiment, during the dicing, the blade is laterally between, and does not contact, the first sidewall of the first opening and the second sidewall of the second opening. In an embodiment, the redistribution structure is free of a seal ring.

In an embodiment, a semiconductor package includes a lower package including a die and a conductive pillar proximate the die, the die and the conductive pillar being over a redistribution structure; and a molding material over the redistribution structure, the molding material being interposed between the die and the conductive pillar, the molding material extending beyond lateral extents of the redistribution structure. In an embodiment, a first portion of the molding material extending beyond the lateral extents of the redistribution structure has a first height, and a second portion of the molding material contacting the die has a second height, where the first height is smaller than the second height. In an embodiment, the semiconductor package further includes a top package electrically coupled to the conductive pillar.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   attaching a first die and a second die to a carrier;
   forming a molding material between the first die and the second die;
   forming a redistribution structure over the first die, the second die and the molding material, the redistribution structure comprising:
   a first redistribution region over the first die;
   a second redistribution region over the second die; and
   a dicing region between the first redistribution region and the second redistribution region, wherein the redistribution structure is free of a seal ring;
   after forming the redistribution structure, forming a first opening and a second opening in the dicing region by performing a pre-cut process, the pre-cut process removing portions of the dicing region using a first laser beam and a second laser beam to form the first opening and the second opening, respectively, the pre-cut process being different from a patterning process performed to pattern a topmost layer of the redistribution structure distal from the carrier, the first opening and the second opening extending through the redistribution structure and exposing a first side of the molding material;
   attaching the redistribution structure to a tape after forming the first opening and the second opening; and
   separating the first die and the second die by cutting through a portion of the molding material aligned with the dicing region using a blade, wherein the cutting is performed from a second side of the molding material toward the first side of the molding material, the second side opposing the first side, wherein during the cutting, the blade does not cut into the tape.

2. The method of claim 1, wherein the dicing region is free of electrically conductive features.

3. The method of claim 1, wherein the first opening and the second opening are physically separated from each other.

4. The method of claim 1, wherein the first opening and the second opening extend into the molding material by a depth between about 20 µm and about 100 µm.

5. The method of claim 1, wherein the first laser beam and the second laser beam are applied to the dicing region at a same time.

6. The method of claim 1, wherein the first opening is laterally between the first die and the second opening, wherein a first width of the blade is smaller than a second width between a first sidewall of the first opening closest to the first die and a second sidewall of the second opening closest to the second die.

7. The method of claim 6, wherein during the cutting, the blade is laterally between the first sidewall of the first opening and the second sidewall of the second opening.

8. The method of claim 1, further comprising, before separating the first die and the second die:
forming a first conductive pillar in the molding material adjacent to the first die;
forming a second conductive pillar in the molding material adjacent to the second die; and
attaching a first package and a second package to the first conductive pillar and the second conductive pillar, respectively.

9. A method comprising:
forming a first conductive pillar and a second conductive pillar over a first side of a carrier;
attaching a first die and a second die to the first side of the carrier, the first die and the second die being adjacent to the first conductive pillar and the second conductive pillar, respectively;
forming a molding material over the first side of the carrier, the molding material extending along sidewalls of the first die, sidewalls of the second die, sidewalls of the first conductive pillar and sidewalls of the second conductive pillar;
forming a redistribution structure over the first die, the second die and the molding material, the redistribution structure comprising a first redistribution region over the first die, a second redistribution region over the second die, and a dicing region between the first redistribution region and the second redistribution region, wherein the redistribution structure is free of a seal ring, wherein forming the redistribution structure comprises performing a patterning process to pattern a topmost layer of the redistribution structure distal from the carrier;
after patterning the topmost layer of the redistribution structure, removing portions of the redistribution structure in the dicing region by a pre-cut process, the pre-cut process using laser beams to form a first opening proximate to the first die and a second opening proximate to the second die, the pre-cut process being different from the patterning process, the first opening being separated from the second opening by a remaining portion of the redistribution structure in the dicing region;
after removing portions of the redistribution structure, attaching the redistribution structure to a tape;

de-bonding the carrier;
electrically coupling a first semiconductor package to the first conductive pillar;
electrically coupling a second semiconductor package to the second conductive pillar; and
after electrically coupling the first semiconductor package and electrically coupling the second semiconductor package, dicing, from a backside of the first die, through the molding material using a blade, the dicing separating the first die from the second die, the blade having a first width larger than a second width of the remaining portion of the redistribution structure, wherein the blade does not cut into the tape during the dicing.

10. The method of claim 9, wherein removing portions of the redistribution structure in the dicing region further removes portions of the molding material such that the first opening and the second opening extend into the molding material.

11. The method of claim 9, wherein a first sidewall of the first opening closest to the first die is spaced apart from a second sidewall of the second opening closest to the second die by a third width, and wherein the first width is smaller than the third width.

12. The method of claim 11, wherein during the dicing, the blade is laterally between, and does not contact, the first sidewall of the first opening and the second sidewall of the second opening.

13. A method comprising:
forming a first conductive pillar and a second conductive pillar on a first side of a carrier;
attaching a first die and a second die to the first side of the carrier, the first die being adjacent to the first conductive pillar and the second die being adjacent to the second conductive pillar;
embedding the first die, the second die, the first conductive pillar, and the second conductive pillars in a molding material;
forming a redistribution structure over the molding material, the redistribution structure comprising a first redistribution region over the first die, a second redistribution region over the second die, and a dicing region between the first redistribution region and the second redistribution region, the redistribution structure being free of a seal ring, wherein forming the redistribution structure comprises patterning a topmost layer of the redistribution structure distal from the carrier using a patterning process;
after patterning the topmost layer of the redistribution structure, forming a first recess and a second recess from a first side of the redistribution structure distal to the carrier by performing a pre-cut process different from the patterning process, the pre-cut process removing at least portions of the dicing region using laser, the first recess and the second recess extending through the redistribution structure and into the molding material, the first recess and the second recess being separated by a remaining portion of the dicing region, wherein the first recess includes a first sidewall distal from the remaining portion of the dicing region, a second sidewall parallel to the first sidewall, and a first bottom surface connecting the first sidewall and the second sidewall, wherein the second recess includes a third sidewall distal from the remaining portion of the dicing region, a fourth sidewall parallel to the third sidewall, and a second bottom surface connecting the third sidewall and the fourth sidewall;

after forming the first recess and the second recess, attaching the redistribution structure to a dicing tape;

removing the carrier;

bonding a first package to the first conductive pillar and bonding a second package to the second conductive pillar; and removing a portion of the molding material aligned with the remaining portion of the dicing region by cutting the molding material using a blade, wherein the cutting is performed from a first side of the molding material distal to the redistribution structure, wherein a width of the blade is wider than a width of the remaining portion of the dicing region, wherein during the cutting, the blade contacts the second sidewall and the fourth sidewall but does not contact the first sidewall or the third sidewall, and the blade does not cut into the dicing tape.

14. The method of claim 13, wherein during the cutting, the blade is laterally between the first sidewall of the first recess and the third sidewall of the second recess.

15. The method of claim 1, wherein after separating the first die and the second die, the molding material has a lower portion contacting the redistribution structure and having an upper portion distal from the redistribution structure, wherein a first sidewall of the lower portion of the molding material is parallel to a second sidewall of the upper portion of the molding material.

16. The method of claim 15, wherein the molding material further comprises a lower surface between and connecting the first sidewall and the second sidewall, wherein the lower surface of the molding material is perpendicular to the first sidewall and the second sidewall.

17. The method of claim 13, wherein a width of the dicing region is about 40 μm.

18. The method of claim 13, wherein forming the first recess and the second recess comprises forming the first recess and the second recess by removing at least portions of the dicing region using a first laser beam and a second laser beam, respectively.

19. The method of claim 18, wherein the first laser beam and the second laser beam are applied to the dicing region at a same time.

20. The method of claim 13, further comprising adjusting a power of the laser in accordance with a composition of the dicing region, depths of the first and second recesses, or a target processing speed for forming the first and second recesses.

* * * * *